(12) United States Patent
Kwack

(10) Patent No.: US 8,860,028 B2
(45) Date of Patent: Oct. 14, 2014

(54) THIN FILM TRANSISTOR SUBSTRATE AND METHOD OF FABRICATING THE SAME

(75) Inventor: Hee-Young Kwack, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/607,977

(22) Filed: Sep. 10, 2012

(65) Prior Publication Data

US 2013/0087794 A1   Apr. 11, 2013

(30) Foreign Application Priority Data

Oct. 6, 2011   (KR) .................. 10-2011-0101959

(51) Int. Cl.
   *G02F 1/1343*   (2006.01)
   *H01L 27/02*    (2006.01)
   *H01L 27/12*    (2006.01)

(52) U.S. Cl.
   CPC ............ *H01L 27/1288* (2013.01); *H01L 27/02* (2013.01)
   USPC ................. 257/59; 257/72; 257/79; 349/139; 349/141; 349/147; 349/151

(58) Field of Classification Search
   CPC ......... H01L 27/15; H01L 33/08; H01L 33/42; G02F 1/1343; G02F 1/134363
   USPC ........ 257/59, 72, 79; 349/139, 141, 143, 147, 349/151
   See application file for complete search history.

(56) References Cited

U.S. PATENT DOCUMENTS

2012/0280237 A1*  11/2012  Kwack et al. ............... 257/59

* cited by examiner

*Primary Examiner* — Tucker Wright
*Assistant Examiner* — Mark Hatzilambrou
(74) *Attorney, Agent, or Firm* — Morgan, Lewis & Bockius LLP

(57) ABSTRACT

Disclosed are a thin film transistor substrate and a method of fabricating the same in which the number of processes is reduced. The method includes forming a first conductive pattern including gate electrodes and gate lines on a substrate through a first mask process, depositing a gate insulating film and forming a second conductive pattern including a semiconductor pattern, source and drain electrodes and data lines through a second mask process, depositing first and second passivation films and forming pixel contact holes passing through the first and second passivation films and exposing the drain electrodes through a third mask process, and forming a third conductive pattern including a common electrode and a common line and forming a third passivation film formed in an undercut structure with the common electrode through a fourth mask process, simultaneously, and forming a fourth conductive pattern including pixel electrodes through a lift-off process.

6 Claims, 14 Drawing Sheets

THIN FILM TRANSISTOR SUBSTRATE AND METHOD OF FABRICATING THE SAME

This application claims the benefit of Korean Patent Application No. 10-2011-0101959, filed on Oct. 6, 2011, which is hereby incorporated by reference in its entirety.

BACKGROUND OF THE INVENTION

1. Field of the Invention

The present invention relates to a thin film transistor substrate and a method of fabricating the same, and more particularly, to a thin film transistor substrate and a method of fabricating the same in which the number of processes is reduced.

2. Discussion of the Related Art

A liquid crystal display device displays an image by adjusting light transmittance of liquid crystals having dielectric anisotropy using an electric field. Such a liquid crystal display device includes a liquid crystal display panel including a thin film transistor substrate and a color filter substrate bonded to each other opposite each other, a backlight unit irradiating light to the liquid crystal display panel, and a driving circuit unit to drive the liquid crystal display panel.

The thin film transistor substrate includes gate lines and data lines formed on a lower substrate so as to intersect each other under the condition a gate insulating film is interposed between the gate lines and the data lines, thin film transistors (TFTs) formed at the intersections, pixel electrodes connected to drain electrodes of the TFTs through contact holes, and a lower alignment film applied thereto.

The color filter substrate includes color filters to implement colors, a black matrix to prevent light leakage, a common electrode forming a vertical electric field with the pixel electrodes, and an upper alignment film applied thereto to align liquid crystals.

The liquid crystal display panel may be formed in a twisted-nematic (TN) mode in which electrodes are respectively installed on two substrates and liquid crystal directors are aligned to be twisted at an angle of 90° and are driven by applying voltage to the electrodes. Further, an in-plane switching (IPS) mode in which two electrodes are formed on one substrate and liquid crystal directors are adjusted by a horizontal electric field generated between the two electrodes, or a fringe field switching (FFS) mode in which two electrodes are formed of transparent conductors and an interval between the two electrodes is reduced so that liquid crystal molecules are operated by a fringe field formed between the two electrodes may be used.

Here, a method of fabricating an FFS mode thin film transistor substrate includes a process of forming gate electrodes using a first mask, a process of forming a semiconductor pattern using a second mask, a process of forming source/drain electrodes using a third mask, a process of forming a first passivation film including pixel contact holes and contact holes of pad areas using a fourth mask, a process of forming pixel electrodes using a fifth mask, a process of forming a second passivation film including pixel contact holes and contact holes of pad areas using a sixth mask, and a process of forming a common electrode on the second passivation film using a seventh mask. The method of fabricating the FFS mode thin film transistor substrate requires at least seven mask processes, as described above, and may thus cause increase in process costs and process time.

SUMMARY OF THE INVENTION

Accordingly, the present invention is directed to a thin film transistor substrate and a method of fabricating the same that substantially obviate one or more problems due to limitations and disadvantages of the related art.

An object of the present invention is to provide a thin film transistor substrate and a method of fabricating the same in which the number of processes is reduced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor substrate includes a plurality of gate lines, a plurality of data lines intersecting the plurality of gate lines, thin film transistors, each of which includes a gate electrode connected to the plurality of gate lines, a source electrode connected to the plurality of data lines, a drain electrode formed opposite the source electrode, and a semiconductor pattern overlapping the gate electrode such that a gate insulating film is interposed between the semiconductor pattern and the gate electrode, first to third passivation films covering the thin film transistors, and including pixel contact holes to expose the drain electrode of each of the thin film transistors, pixel electrodes connected to the drain electrode and formed within groove of the third passivation film, and a common electrode forming a fringe field with the pixel electrodes and separated from the pixel electrodes by a space provided by an undercut structure with the third passivation film.

The thin film transistor substrate may further include gate pads connected to the plurality of gate lines and data pads connected to the plurality of data lines.

Each of the gate pads may include a gate pad lower electrode connected to the plurality of gate lines, first to fourth gate contact holes passing through the first to third passivation films and the gate insulating film, and a gate pad upper electrode connected to the gate pad lower electrode, formed of the same material as the pixel electrodes in the same layer as the pixel electrodes, and separated from the common electrode by the space provided by the undercut structure.

Each of the data pads may include a data pad lower electrode connected to the plurality of data lines, first to third data contact holes passing through the first to third passivation films, and a data pad upper electrode connected to the data pad lower electrode, formed of the same material as the pixel electrodes in the same layer as the pixel electrodes, and separated from the common electrode by the space provided by the undercut structure.

The thickness of the pixel electrodes may be greater than the thickness of the common electrode.

The width of the third passivation film may be smaller than the width of the second passivation film.

In another aspect of the present invention, a method of fabricating a thin film transistor substrate includes forming a first conductive pattern including gate electrodes and gate lines on a substrate through a first mask process, depositing a gate insulating film on the substrate provided with the first conductive pattern, and forming a second conductive pattern including a semiconductor pattern, source and drain electrodes and data lines on the gate insulating film through a second mask process, depositing first and second passivation films on the substrate provided with the second conductive pattern, and forming pixel contact holes passing through the first and second passivation films and exposing the drain electrodes through a third mask process, and forming a third conductive pattern including a common electrode and a common line on the first and second passivation films and a third passivation film formed in an undercut structure with the common electrode through a fourth mask process, simultaneously, and forming a fourth conductive pattern including pixel electrodes through a lift-off process.

The formation of the third conductive pattern and the fourth conductive pattern may include sequentially depositing a first transparent electrode layer, the third passivation film and a photoresist on the first and second passivation films, forming first and second photoresist patterns having different thicknesses through the fourth mask process, patterning the third passivation film through a dry etching process using the first and second photoresist patterns, forming the common electrode having the undercut structure with the third passivation film through a wet etching process of the first transparent electrode layer, removing the second photoresist pattern and reducing the thickness of the first photoresist pattern by ashing the first and second photoresist patterns, forming the undercut structure of the third passivation film with the first photoresist pattern and groove of the third passivation film through a dry etching process, and forming the pixel electrodes within the groove of the third passivation film by depositing a second transparent conductive layer on the third passivation film and the first photoresist pattern and removing the first photoresist pattern and the second transparent conductive layer formed thereon through the lift-off process.

A space may be formed between the first photoresist pattern and the third passivation film.

During the lift-off process, a stripper may permeate the space between the first photoresist pattern and the third passivation film and thus separate the first photoresist pattern and the second transparent electrode layer formed thereon from the third passivation film.

The method may further include forming gate pads connected to the gate lines, and the formation of the gate pads may include forming gate pad lower electrodes of the same material as the gate electrodes simultaneously with the gate electrodes through the first mask process, and forming first to fourth gate contact holes passing through the first to third passivation films and the gate insulating film through the etching process using the first and second photoresist patterns, and simultaneously, forming gate pad upper electrodes of the same material as the pixel electrodes simultaneously with the pixel electrodes through the lift-off process.

The gate pad upper electrodes and the common electrode may be separated from each other by the space provided by the undercut structure.

The method may further include forming data pads connected to the data lines, and the formation of the data pads may include forming data pad lower electrodes of the same material as the source and drain electrodes simultaneously with the source and drain electrodes through the second mask process, and forming first to third data contact holes passing through the first to third passivation films through the etching process using the first and second photoresist patterns, and simultaneously, forming data pad upper electrodes of the same material as the pixel electrodes simultaneously with the pixel electrodes through the lift-off process.

The data pad upper electrodes and the common electrode may be separated from each other by the space provided by the undercut structure.

The thickness of the pixel electrodes may be greater than the thickness of the common electrode.

The width of the third passivation film may be smaller than the width of the second passivation film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Configuration of the present invention and function thereby will be given through detailed description below. Wherever possible, the same reference numbers will be used throughout the drawings to refer to the same or like parts. In the following description of the present invention, a detailed description of known functions and configurations incorporated herein will be omitted when it may make the subject matter of the present invention rather unclear.

Hereinafter, a preferred embodiment of the present invention will be described with reference to FIGS. 1 to 8F.

Figure 1:
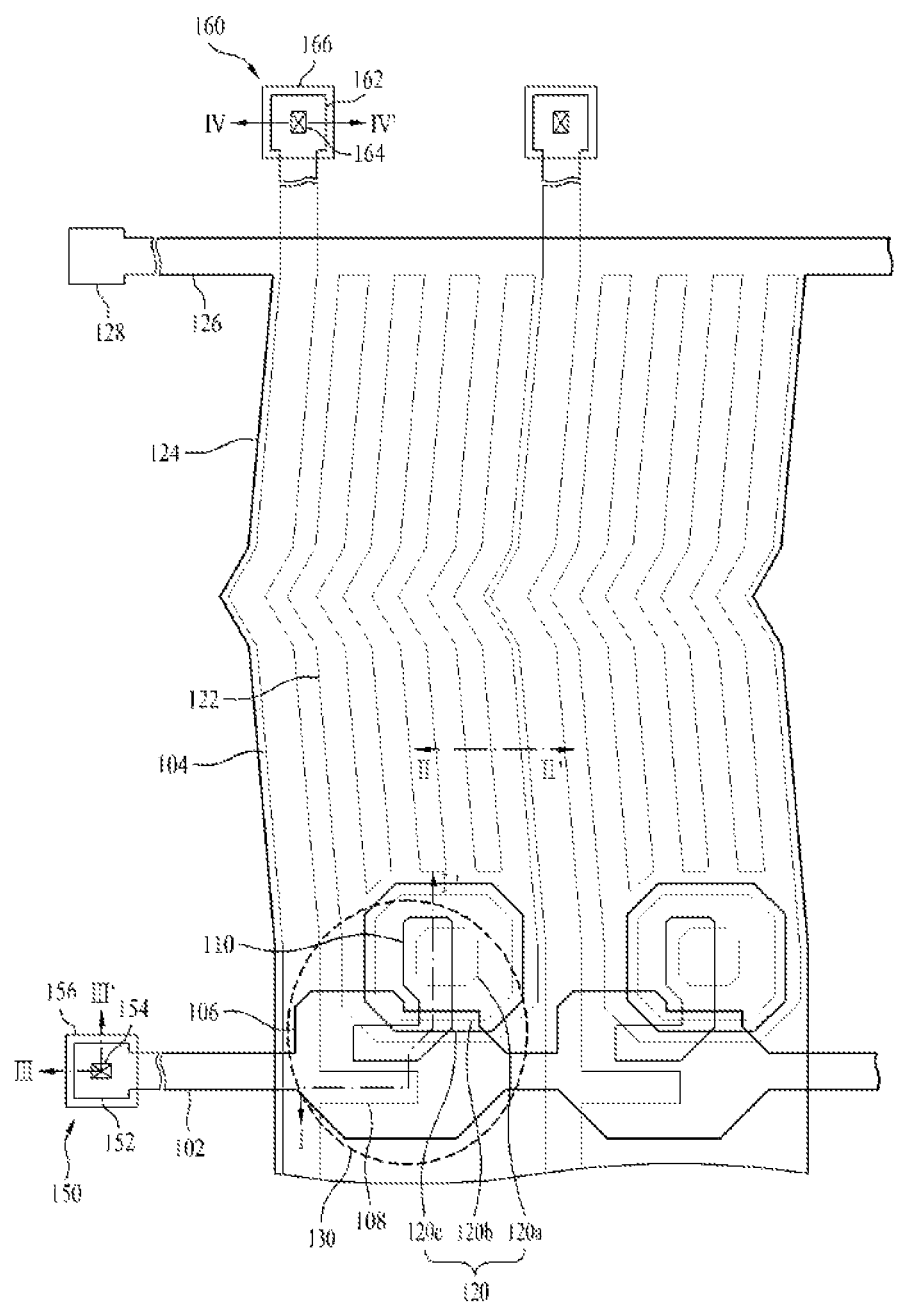
FIG. 1 is a plan view illustrating a thin film transistor substrate in accordance with one embodiment of the present invention.
Figure 2:
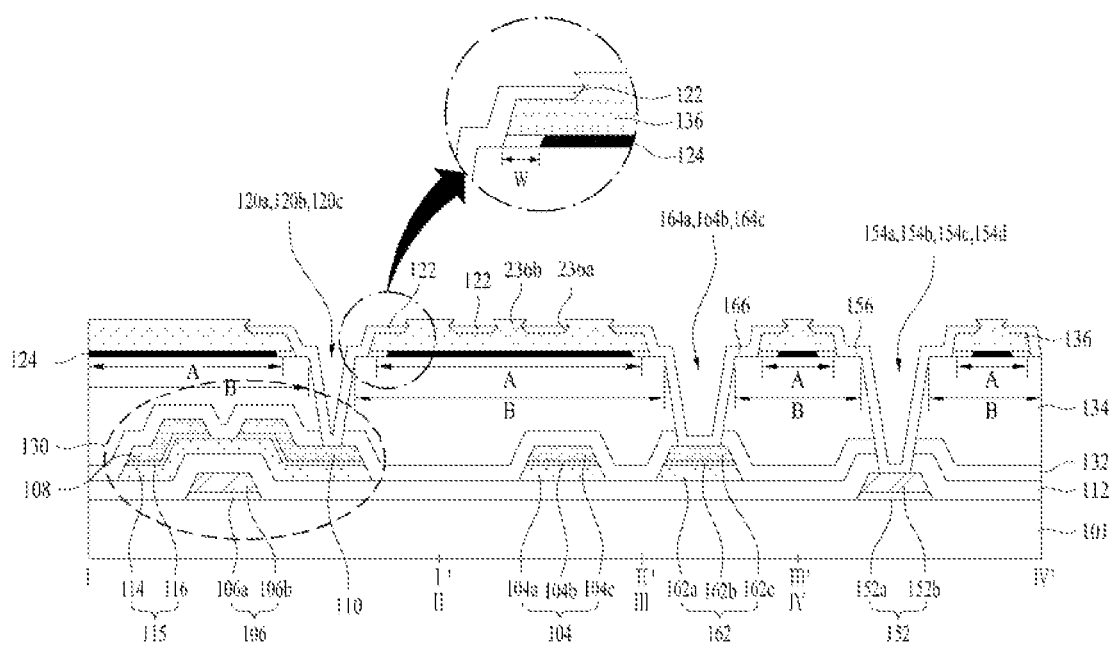
FIG. 2 is a cross-sectional view taken along the lines I-I', II-II', III-III' and IV-IV' of the thin film transistor substrate shown in FIG. 1.

FIG. 1 is a plan view illustrating a thin film transistor substrate in accordance with one embodiment of the present invention, and FIG. 2 is a cross-sectional view taken along the lines I-I', II-II', III-III' and IV-IV' of the thin film transistor substrate shown in FIG. 1.

The thin film transistor substrate shown in FIGS. 1 and 2 includes thin film transistors 130 respectively connected to gate lines 102 and data lines 104, pixel electrodes 122 formed at pixel areas provided at intersections, a common electrode 124 forming a fringe field with the pixel electrodes 122, gate pads 150 connected to the gate lines 102, data pads 160 connected to the data lines 104, and a common pad 128 connected to a common line 126.

The thin film transistors 130 charge the pixel electrodes 122 with a pixel signal supplied to the data lines 104 in response to a scan signal supplied to the gate lines 102, and maintains the pixel electrodes 122 charged with the pixel signal. For this purpose, the thin film transistor 130 includes a gate electrode 106, a source electrode 108, a drain electrode 110, an active layer 114 and an ohmic contact layer 116.

The gate electrode 106 is connected to the gate line 102 so that the scan signal from the gate line 102 is supplied to the gate electrode 106. The source electrode 108 is connected to the data line 104 so that the pixel signal from the data line 104 is supplied to the source electrode 108. The drain electrode 110 is formed opposite the source electrode 108 under the condition that a channel part of the active layer 114 is interposed between the drain electrode 110 and the source electrode 108, and supplies the pixel signal from the data line 104 to the pixel electrode 122. The active layer 114 overlaps with the gate electrode 106 under the condition that a gate insulating film 112 is interposed between the active layer 114 and the gate electrode 106, and forms the channel part between the source electrode 108 and the drain electrode 110. The ohmic contact layer 116 is formed between the source and drain electrodes 108 and 110 and the active layer 114, i.e., on the active layer 114 except for the channel part. The ohmic contact layer 116 serves to reduce electrical contact resistance between the source 108 and the active layer 114, and between the drain electrode 110 and the active layer 114.

The pixel electrode 122 is connected to the drain electrode 110 of the thin film transistor 130 through first to third pixel contact holes 120a, 120b and 120c, and is formed within groove 236a of a third passivation film 136 formed on the common electrode 124. Thereby, the pixel signal from the data line 104 is supplied to the pixel electrode 122 through the thin film transistor 130.

The common electrode 124 is connected to the common line 126, and thus, common voltage is supplied to the common electrode 124 through the common line 126. The common electrode 124 overlaps the pixel electrode 122 under the condition that the third passivation film 136 is interposed between the common electrode 124 and the pixel electrode 122, thus forming a fringe field. Due to such a fringe field, liquid crystal molecules arranged in the horizontal direction between the thin film transistor substrate and the color filter substrate are rotated by dielectric anisotropy. Further, transmittance of light transmitted by the pixel areas is varied according to a rotating degree of the liquid crystal molecules, thereby producing an image. Here, the common electrode 124 is formed on a second passivation film 134 and has an undercut structure with the third passivation film 136, and the common electrode 124 and the pixel electrode 122 are separated from each other by the undercut structure between the common electrode 124 and the third passivation film 136, as shown in FIG. 2. A space W is provided between the common electrode 124 and the pixel electrode 122 by the undercut structure. In order to reduce generation of parasitic capacitance between the common electrode 124 and the data line 104, the second passivation film 134 is formed of an organic insulating material, for example, photo acryl, and may thus increase a distance between the common electrode 124 and the data line 104.

The thickness of the pixel electrode 122 is greater than the thickness of the common electrode 124. By forming the undercut structure of the common electrode 124 with the third passivation film 136, as described above, the width of the third passivation film 136 is greater than the width of the common electrode 124. Thereby, when the pixel electrode 122 is deposited on the third passivation film 136 having the undercut structure, the thickness of the pixel electrode 124 is formed thicker than the thickness of the common electrode 124, to prevent opening of the pixel electrode 122.

Further, in order to improve step coverage of the pixel electrode 122 formed on the third passivation film 136, as shown in FIG. 2, the width A of the third passivation film 136 is formed to be smaller than the width B of the second passivation film 134.

The common electrode 124 is formed of a transparent electrode material, and tin oxide (TO), indium tin oxide (ITO), indium zinc oxide (IZO), indium tin zinc oxide (ITZO), etc. may be used as the transparent electrode material.

The gate pad 150 supplies a scan signal from a gate driver (not shown) to the gate line 102. For this purpose, the gate pad 150 includes a gate pad lower electrode 152 connected to the gate line 102, and a gate pad upper electrode 156 connected to the gate pad lower electrode 152 through first to fourth gate contact holes 154a, 154b, 154c and 154d passing through the first to third passivation films 132, 134 and 136 and the gate insulating film 112. The gate pad upper electrode 156 is formed of the same material as the pixel electrode 122 in the same layer as the pixel electrode 122 simultaneously with the pixel electrode 122 when the pixel electrode 122 is formed. The gate pad upper electrode 156 is separated from the common electrode 124 formed on the second passivation film 134 so as not to be connected to the common electrode 124. That is, the common electrode 124 and the gate pad upper electrode 156 are separated from each other by the space provided due to the undercut structure so as not to be connected to each other. The gate pad lower electrode 152 includes at least two layers 152a and 152b, as shown in FIG. 2.

The data pad 160 supplies the pixel signal from a data driver (not shown) to the data line 104. For this purpose, the data pad 160 includes a data pad lower electrode 162 connected to the data line 104, and a data pad upper electrode 166 connected to the gate pad lower electrode 162 through first to third data contact holes 164a, 164b and 164c passing through the first to third passivation films 132, 134 and 136. The data pad upper electrode 166 is formed of the same material as the pixel electrode 122 in the same layer as the pixel electrode 122 simultaneously with the pixel electrode 122 when the pixel electrode 122 is formed. The data pad upper electrode 166 is separated from the common electrode 124 formed on the second passivation film 134 so as not to be connected to the common electrode 124. That is, the common electrode 124 and the data pad upper electrode 166 are separated from each other by the space provided due to the undercut structure so as not to be connected to each other. The data pad lower electrode 162 has a structure in which semiconductor layers 162a and 162b and a drain electrode 162c are stacked, as shown in FIG. 2.

FIGS. 3A to 8F are plan and cross-sectional views illustrating a method of fabricating the thin film transistor substrate shown in FIG. 2.

Figure 3A:
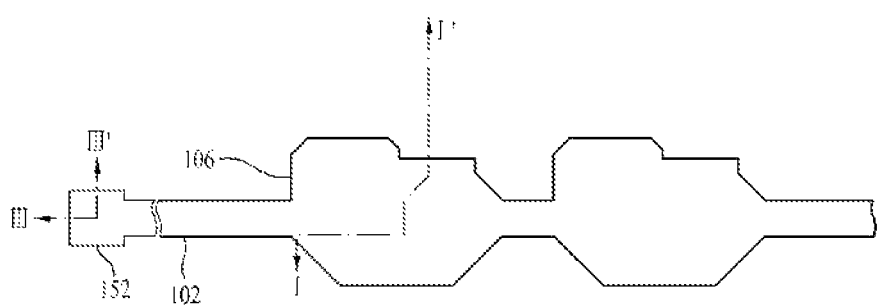
FIGS. 3A and 3B are plan and cross-sectional views illustrating a method of fabricating a first conductive pattern of the thin film transistor substrate shown in FIGS. 1 and 2.
Figure 3B:
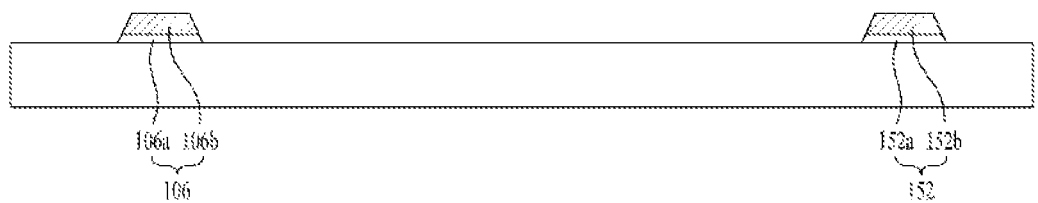

With reference to FIGS. 3A and 3B, a first conductive pattern including the gate electrodes 106, the gate lines 102 and the gate pad lower electrodes 152 is formed on a substrate 101.

In more detail, a gate metal layer including at least two layers is formed on the substrate 101 through a deposition method, such as sputtering. The gate metal layer may have a structure in which two or more layers are stacked, such as Al/Cr, Al/Mo, Al(Nd)/Al, Al(Nd)/Cr, Mo/Al(Nd)/Mo, Cu/Mo, Cu/Mo/Ti, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy or Mo/Al alloy, or have a single layer structure using Mo, Ti, Cu, AlNd, Al, Cr, a Mo alloy, a Cu alloy or Al alloy. Thereafter, the first conductive pattern including the gate electrodes 106, the gate lines 102 and the gate pad lower electrodes 152 is formed by patterning the gate metal layers through a photolithography process and an etching process using a first mask.

Figure 4A:
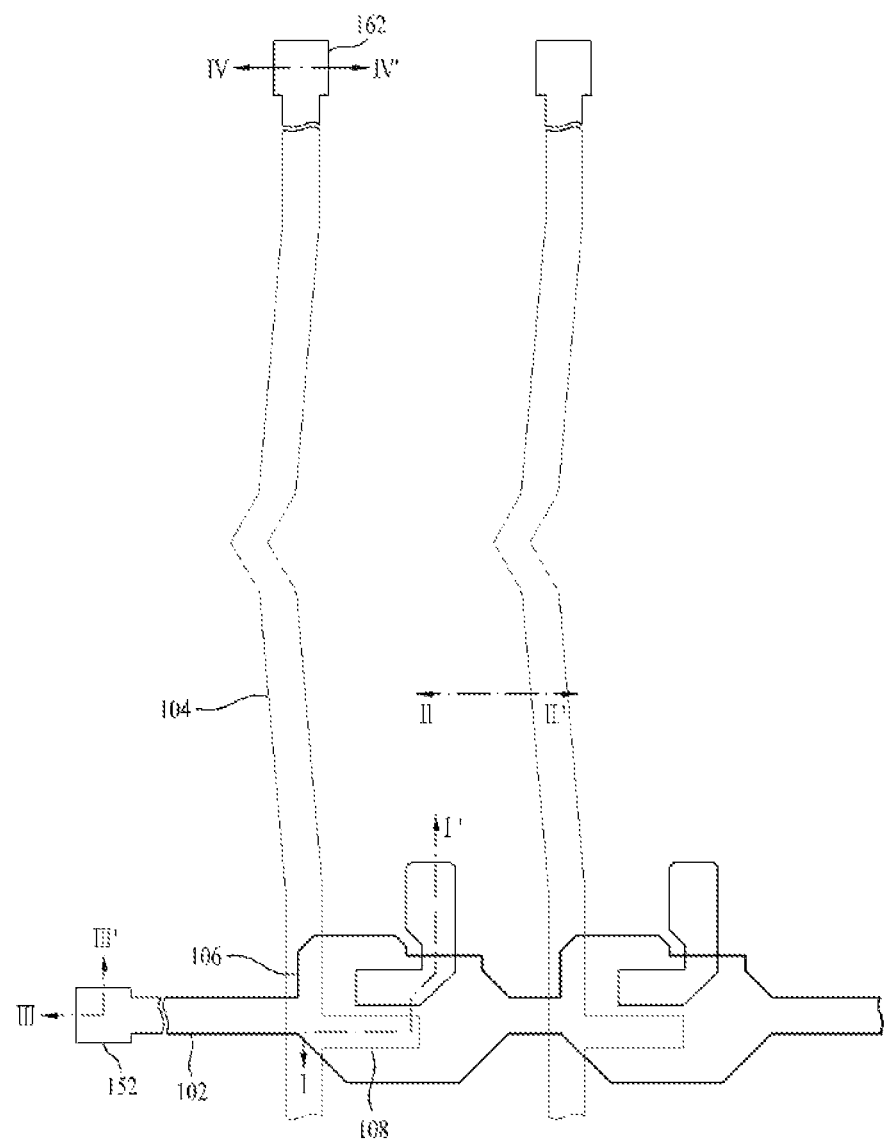
FIGS. 4A and 4B are plan and cross-sectional views illustrating a method of fabricating a semiconductor pattern and a second conductive pattern of the thin film transistor substrate shown in FIGS. 1 and 2.
Figure 4B:
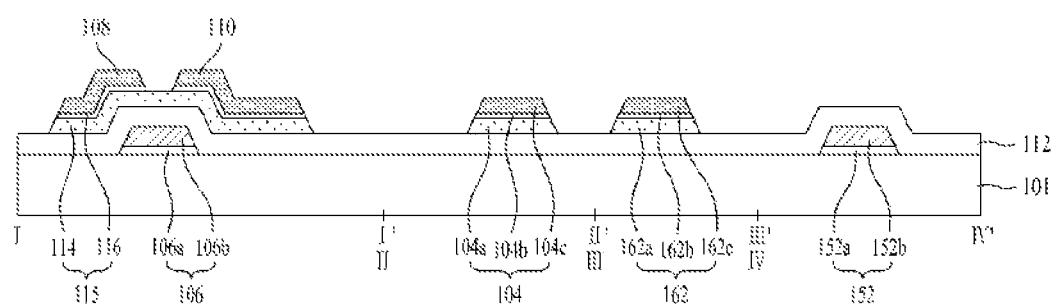

With reference to FIGS. 4A and 4B, the gate insulating film 112 is formed on the substrate 101 provided with the first conductive pattern, and a semiconductor pattern 115 including the active layer 114 and the ohmic contact layer 116, and a second conductive pattern including the source and drain electrodes 108 and 110, the data lines 104 and the data pad lower electrodes 162 are formed on the substrate 101 provided with the gate insulating film 112.

In more detail, the gate insulating film 112, an amorphous silicon layer 132, an amorphous silicon layer 216 doped with an impurity ($n^+$ or $p^+$), and a data metal layer 218 are sequentially formed on the lower substrate 101 provided with the gate metal pattern. For example, the gate insulating film 112, the amorphous silicon layer 132 and the impurity doped amorphous silicon layer 216 are formed through Plasma-enhanced chemical vapor deposition (PECVD), and the data metal layer 218 is formed through sputtering. The gate insulating film 112 is formed of an inorganic insulating material, such as silicon oxide ($SiO_x$) or silicon nitride ($SiN_x$), and the data metal layer 218 may have a single layer structure formed of metal, such as Mo, Ti, Cu, AlNd, Al, Cr, a Mo alloy, a Cu alloy or Al alloy, or have a structure in which two or more layers are stacked, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy or Mo/Al alloy. After a photoresist is applied to the data metal layer 218, and photoresist patterns 220a and 220b having a step difference is formed by exposing and developing the photoresist through a photolithography process using a slit mask or a half tone mask as a second mask. This will be described with reference to FIGS. 5A and 5B.

Figure 5A:
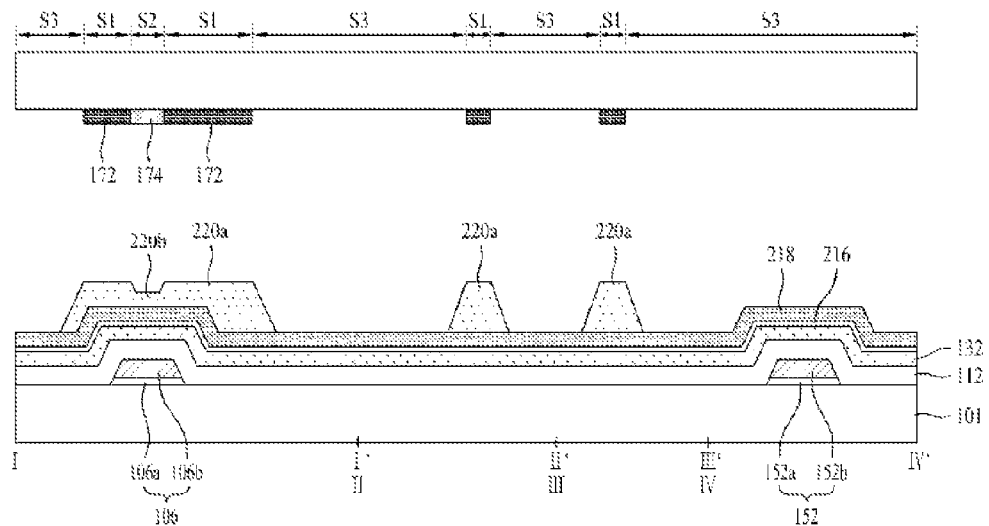
FIGS. 5A and 5B are cross-sectional views illustrating the method of fabricating the semiconductor pattern and the second conductive pattern shown in FIG. 4B.

The half tone mask includes blocking regions S1 provided with a blocking layer 172 formed on a substrate, semi-transmitting regions S2 provided with a semi-transmitting layer 174 formed on the substrate, and transmitting regions S3 provided with the substrate only, as shown in FIG. 5A. The above-described half tone mask may be used, or a slit mask (not shown) may be used. Here, use of the half tone mask will be exemplarily described. Since the blocking regions S1 are located at areas where the semiconductor pattern 115 and the second conductive pattern will be formed and block UV light, a first photoresist pattern 220a remains at the blocking regions S1 after development, as shown in FIG. 5A. Since the semi-transmitting regions S2 include the semi-transmitting layer 174 stacked on areas where channels of the thin film transistors will be formed and adjust light transmittance, a second photoresist pattern 220b that is thinner than the first photoresist pattern 220a remains at the semi-transmitting regions S2 after development, as shown in FIG. 5A. Further, since the transmitting regions S3 transmit all UV light, no photoresist remains at the transmitting regions S3 after development, as shown in FIG. 5A.

Figure 5B:
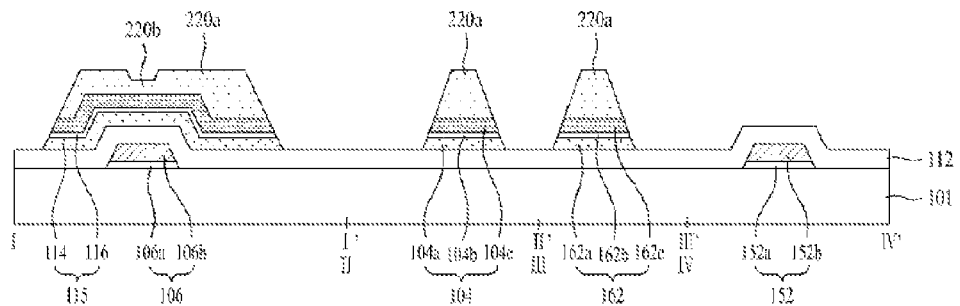

As shown in FIG. 5B, the second conductive pattern and the semiconductor pattern 115 thereunder are formed by patterning the data metal layer 218, the amorphous silicon layer 132 and the impurity ($n^+$ or $p^+$) doped amorphous silicon layer 216 through an etching process using the photoresist patterns 220a and 220b having the step difference.

Thereafter, the thickness of the first photoresist pattern 220a is reduced and the second photoresist pattern 220b is removed through an ashing process using oxygen ($O_2$) plasma. Thereafter, the exposed data metal layer 218 and the impurity doped amorphous silicon layer 216 thereunder are removed through an etching process using the asked first photoresist pattern 220a. Thereby, the source electrodes 108 and the drain electrodes 110 are separated from each other, and the active layer 114 is exposed.

Thereafter, the first photoresist pattern 220a on the source/drain electrodes 108 and 110, the data lines 104 and the data pad lower electrodes 162 is removed through a stripping process.

Figure 6A:
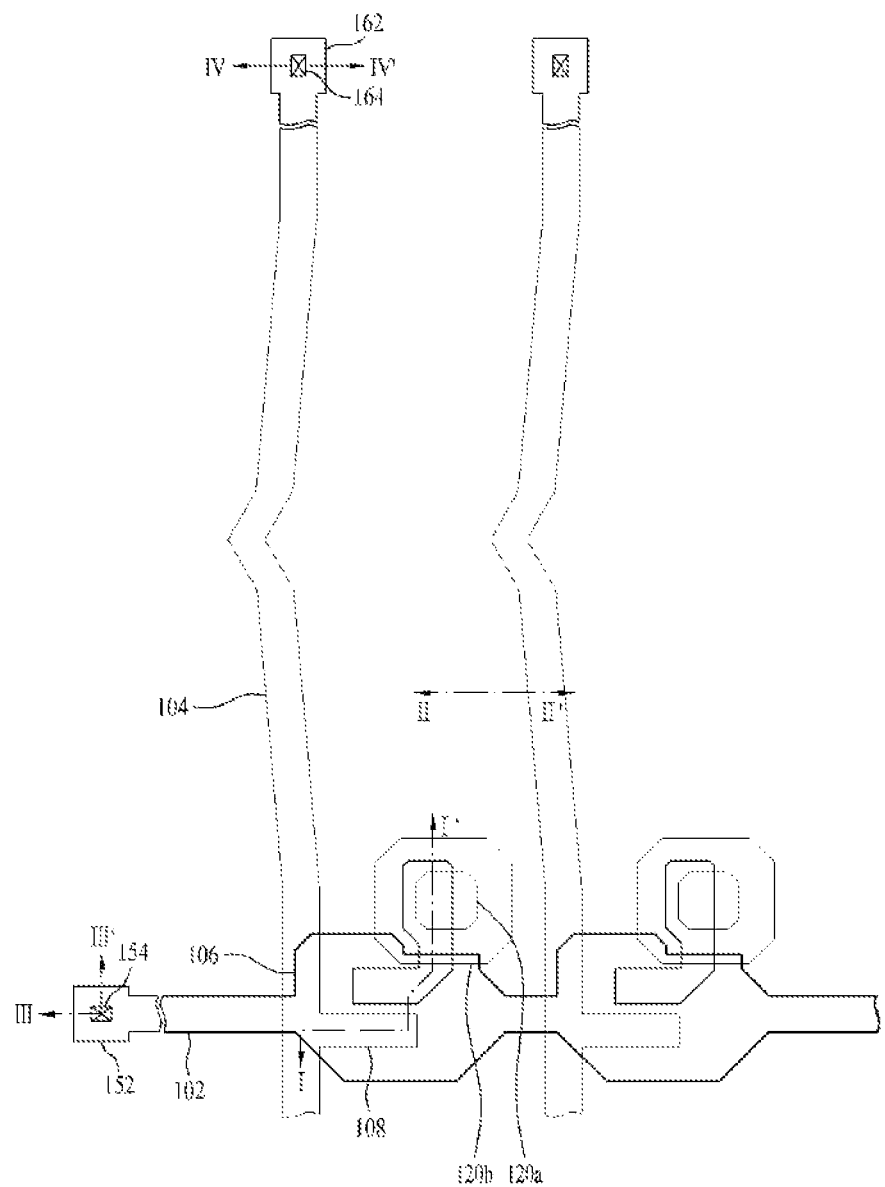
FIGS. 6A and 6B are plan and cross-sectional views illustrating a method of fabricating first and second passivation films of the thin film transistor substrate shown in FIGS. 1 and 2.
Figure 6B:
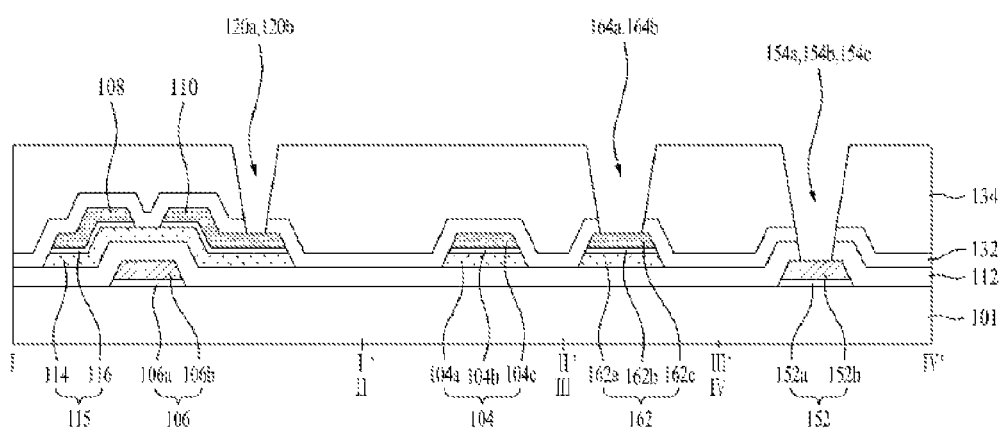

With reference to FIGS. 6A and 6B, the first and second passivation films 132 and 134 having the first to third gate contact holes 154a, 154b and 154c, the first and second data contact holes 164a and 164b and the first and second pixel contact holes 120a and 120b are formed on the substrate 101 provided with the semiconductor pattern 115 and the second conductive pattern.

In more detail, the first and second passivation films 132 and 134 are deposited on the gate insulating film 112 provided with the semiconductor pattern 115 and the second conductive pattern through PECVD or Chemical vapor deposition (CVD). The first passivation film 132 may be formed of the same inorganic insulating material as the gate insulating film 112, and the second passivation film 134 may be formed of an organic insulating material, for example, photo acryl. The first and second passivation films 132 and 134 are patterned through a photolithography process and an etching process using a third mask, thereby forming the first to third gate contact holes 154a, 154b and 154c, the first and second data contact holes 164a and 164b and the first and second pixel contact holes 120a and 120b. The first and second pixel contact holes 120a and 120b pass through the first and second passivation films 132 and 134 to expose the drain electrodes 110, the first to third gate contact holes 154a, 154b and 154c pass through the gate insulating film 112 and the first and second passivation films 132 and 134 to expose the gate pad lower electrodes 152, and the first and second data contact holes 164a and 164b pass through the first and second passivation films 132 and 134 to expose the data pad lower electrodes 162.

Figure 7A:
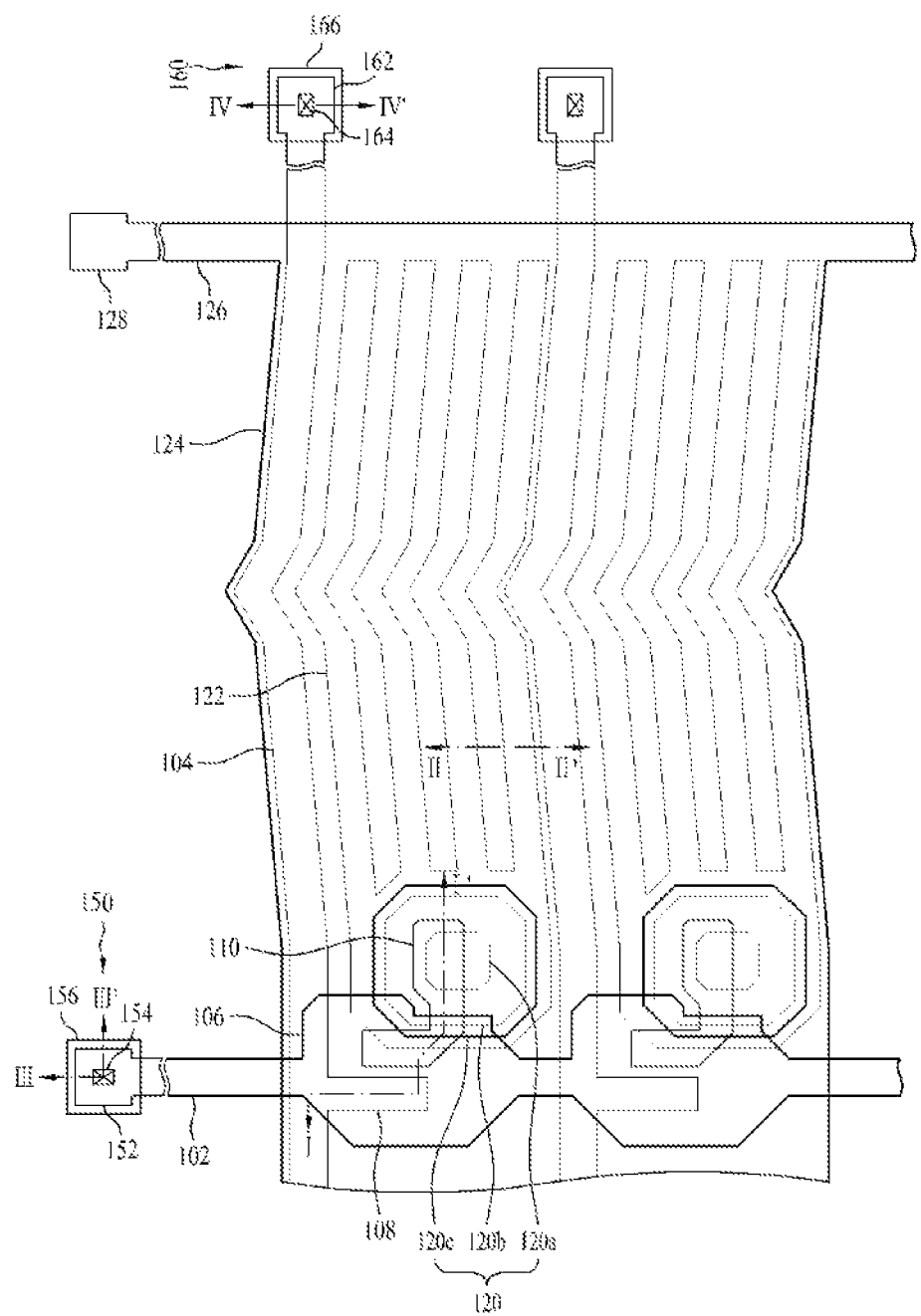
FIGS. 7A and 7B are plan and cross-sectional views illustrating a method of fabricating a third conductive pattern, a fourth conductive pattern and a third passivation film of the thin film transistor substrate shown in FIGS. 1 and 2.
Figure 7B:
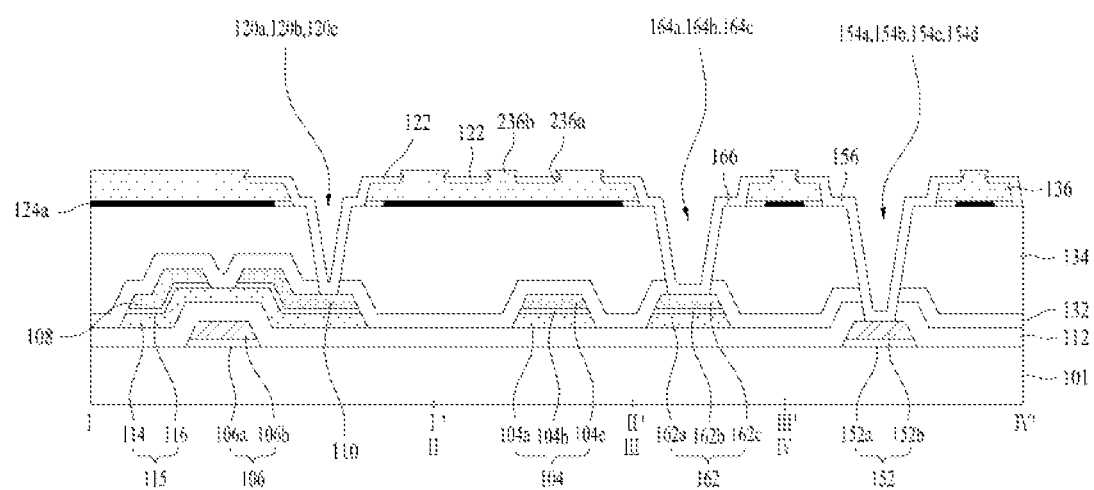

With reference to FIGS. 7A and 7B, a third conductive pattern including the common electrode 124, the common line 126 and the common pad 128 is formed on the substrate 101 provided with the first and second passivation films 132 and 134, and simultaneously, a fourth conductive pattern including the pixel electrodes 122a and 122b, the gate pad upper electrodes 156 and the data pad upper electrodes 166 is formed on a third passivation film 136.

In more detail, a first transparent electrode layer 124a, the third passivation film 136 and a photoresist 220 are sequentially stacked on the substrate 101 provided with the first and second passivation films 132 and 134. The first transparent electrode layer 124a may be formed by depositing tin oxide (TO), indium tin oxide (ITO), indium zinc oxide (IZO) or indium tin zinc oxide (ITZO) through sputtering, and the third passivation film 136 may be formed by depositing an inorganic insulating material through PECVD or CVD. After the photoresist 220 is applied to the third passivation film 136, the photoresist 220 is developed and exposed through a photolithography process using a slit mask or a half tone mask 210 as a fourth mask, thereby forming photoresist patterns 220a and 220b having a step difference. This will be described with reference to FIGS. 8A to 8F.

Figure 8A:
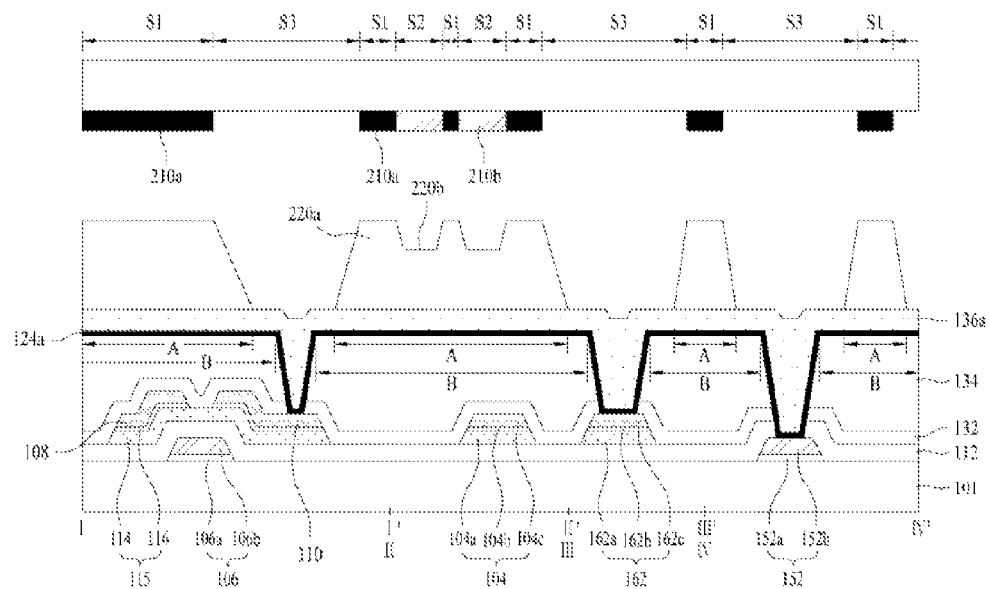
FIGS. 8A to 8F are cross-sectional views illustrating the method of fabricating the third conductive pattern, the fourth conductive pattern and the third passivation film of the thin film transistor substrate shown in FIG. 7B.

The half tone mask 210 includes blocking regions S1 provided with a blocking layer 210a formed on a substrate, semi-transmitting regions S2 provided with a semi-transmitting layer 210b formed on the substrate only, and transmitting regions S3 provided with only the substrate, as shown in FIG. 8A. Since the blocking regions S1 are located at areas where protrusions 236b of the third passivation film 136 will be formed and block UV light, a first photoresist pattern 220a remains at the blocking regions S1 after development, as shown in FIG. 8A. Since the semi-transmitting regions S2 include the semi-transmitting layer 210b stacked on areas where groove 126a of the third passivation film 126 will be formed and adjust light transmittance, a second photoresist pattern 220b that is thinner than the first photoresist pattern 220a remains at the semi-transmitting regions S2 after development, as shown in FIG. 8A. Further, since the transmitting regions S3 are located at areas where the third pixel contact holes 120c, the fourth gate contact holes 154d and the third data contact holes 164c will be formed and transmit all UV light, no photoresist remains at the transmitting regions S3 after development, as shown in FIG. 8A. Further, the blocking layer 210a and the semi-transmitting layer 210b are adjusted such that the width A of the third passivation film 136 is smaller than the width B of the second passivation film 134. Formation of the width A of the third passivation film 136 smaller than the width B of the second passivation film 134 may improve step coverage of the pixel electrodes 122 when the pixel electrodes 122 are deposited.

Figure 8B:
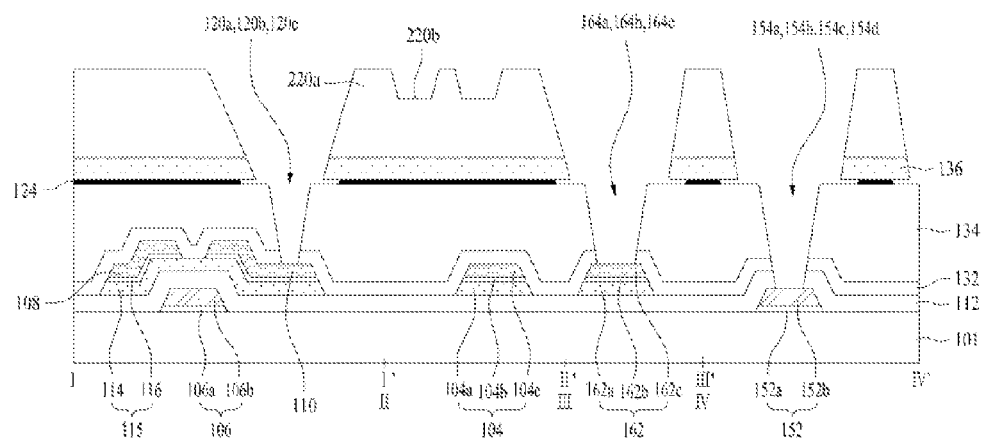

As shown in FIG. 8B, the common electrode 124 is formed by patterning the third passivation film 136a through a dry etching process using the photoresist patterns 220a and 220b having the step difference and by removing the first transparent electrode layer 124a through a wet etching process. Here, the common electrode 124 has an undercut structure in which the common electrode 124 has a smaller width than the third passivation film 136 formed on the common electrode 124, through the wet etching process. Further, the width A of the third passivation film 136 is smaller than the width B of the second passivation film 134 by adjusting the widths of the semi-transmitting layer 210b and the blocking layer 210a, as shown in FIG. 8B.

Figure 8C:
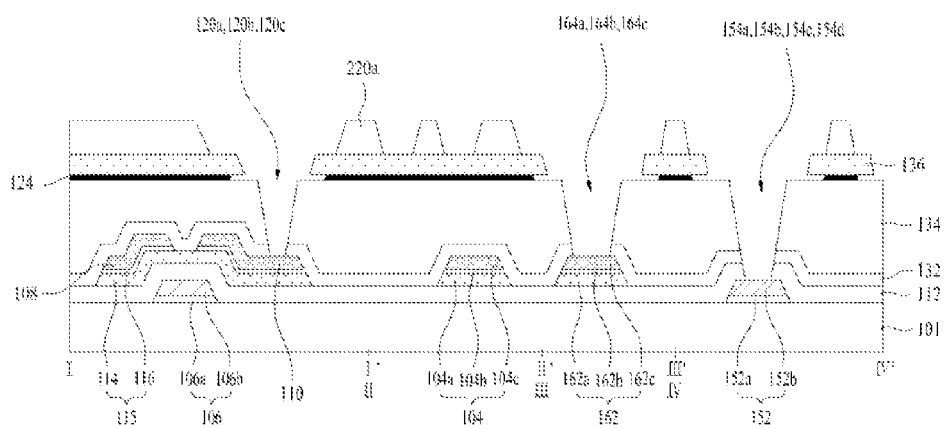

Thereafter, as shown in FIG. 8C, the thickness of the first photoresist pattern 220a is reduced and the second photoresist pattern 220b is removed through an ashing process using oxygen ($O_2$) plasma.

Figure 8D:
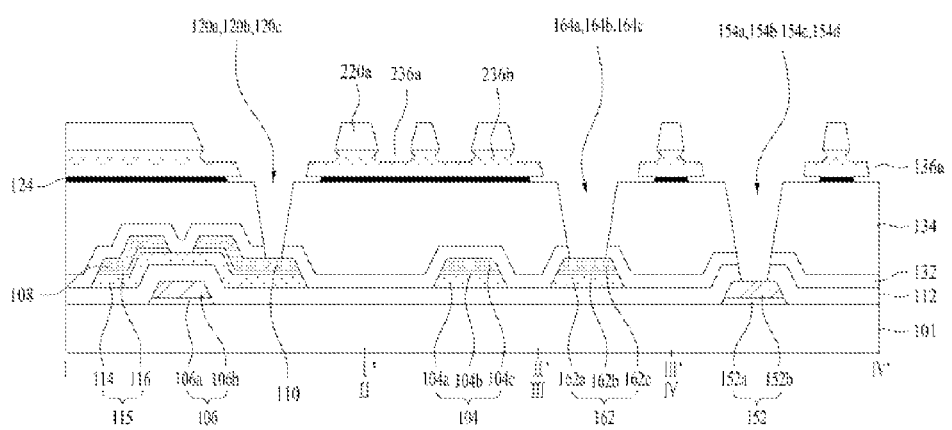

Thereafter, as shown in FIG. 8D, the third passivation film 136 forms an undercut structure in which the width of the third passivation film 136 is smaller than the width of the first photoresist pattern 220a formed on the third passivation film 136 by partially etching the third passivation film 136 thorough a dry etching process. Thereby, the groove 236a and the protrusions 236b are formed on the third passivation film 136.

Figure 8E:
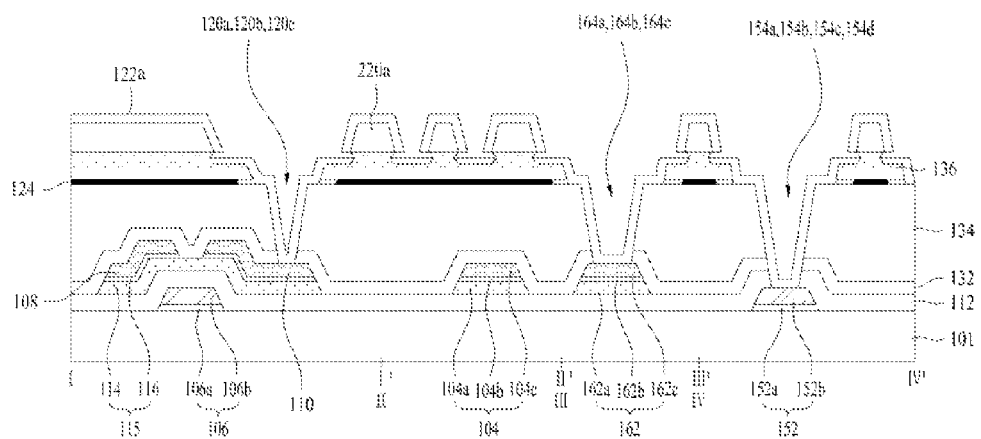
Figure 8F:
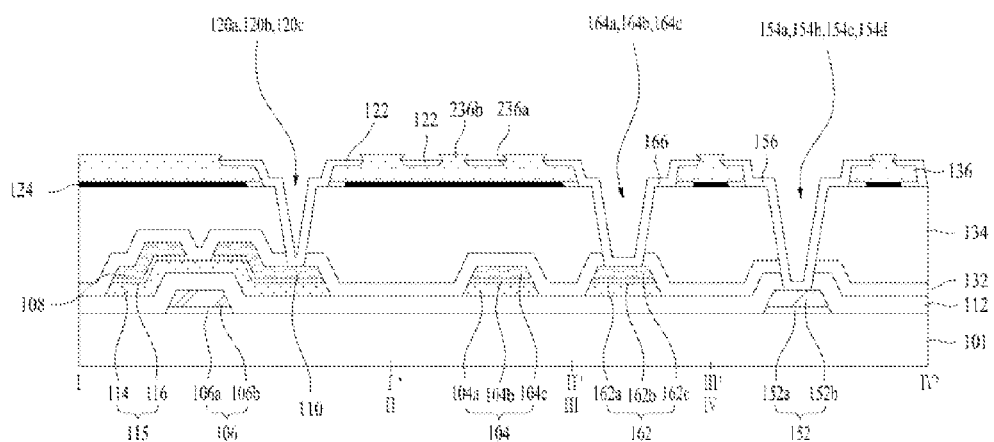

A second transparent electrode layer 122a is deposited on the entire surface of the first photoresist pattern 220a forming the undercut structure with the third passivation film 136, as shown in FIG. 8E. The second transparent electrode layer 122a is deposited within the groove 236a of the third passivation film 136 by the undercut structure, and is deposited on the first photoresist pattern 220a. Further, the second transparent electrode layer 122a is separated from the common electrode 124 by a space provided due to the undercut structure between the third passivation film 136 and the common electrode 124. A space between the first photoresist pattern 220a and the third passivation film 136 is formed by the undercut structure between the first photoresist pattern 220a and the third passivation film 136. Further, the second transparent electrode layer 122a is deposited to a thickness greater than the thickness of the common electrode 124. The reason for this is that the second transparent electrode layer 122a may be opened due to the undercut structure when the second transparent electrode layer 122a is deposited.

Thereby, the second transparent electrode layer 122a is patterned by removing the first photoresist pattern 220a and the second transparent electrode layer 122a formed thereon through a lift-off process. In more detail, in the lift-off process, a stripper permeates the space between the first photoresist pattern 220a and the third passivation film 136 and thus separates the first photoresist pattern 220a and the second transparent electrode layer 122a formed thereon from the third passivation film 136, thereby forming the fourth conductive pattern including the pixel electrodes 122 formed within the groove 236a of the third passivation film 136, the gate pad upper electrodes 156 and the data pad upper electrodes 166. The space between the first photoresist pattern 220a and the third passivation film 136 serves as a penetration path of the stripper, thereby allowing the first photoresist pattern 220a to be easily removed from the third passivation film 136.

As apparent from the above description, in a thin film transistor substrate and a method of fabricating the same in accordance with the present invention, source/drain electrodes and a semiconductor pattern are formed through a process using the same mask, and a third passivation film, a common electrode and pixel electrodes are formed through a process using the same mask, thereby omitting use of at least three masks.

Thereby, while a conventional fringe field mode thin film transistor substrate requires seven mask processes, the thin film transistor substrate in accordance with the present invention may be formed through four mask processes, thus reducing process costs and process time.

Further, the method of fabricating the thin film transistor substrate in accordance with the present invention forms a passivation film using an organic insulating material, such as photo acryl, and reduces parasitic capacitance between data lines and the common electrode, thus reducing power consumption.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate, comprising:
   a gate line;
   a data line intersecting the gate line;
   a thin film transistor including a gate electrode connected to the gate line, a source electrode connected to the data line, a drain electrode formed opposite the source electrode, and a semiconductor pattern overlapping the gate electrode such that a gate insulating film is interposed between the semiconductor pattern and the gate electrode;
   first and second passivation films covering the thin film transistor;

a common electrode formed on the second passivation film;
a third passivation film formed on the common electrode;
a plurality of grooves formed on a top of the third passivation film and
a pixel electrode formed within the plurality of grooves;
wherein first to third passivation films includes a pixel contact hole to expose the drain electrode of the thin film transistor, such that the pixel electrode is connected to the drain electrode via the pixel contact hole,
wherein the common electrode is separated from the pixel electrode by a space provided by an undercut structure with the third passivation film, and
wherein the common electrode and the pixel electrode form a fringe field.

2. The thin film transistor substrate according to claim 1, further comprising:
gate pad connected to the gate line; and
data pad connected to the data line.

3. The thin film transistor substrate according to claim 2, wherein the gate pad includes:
a gate pad lower electrode connected to the gate line;
first to fourth gate contact holes passing through the first to third passivation films and the gate insulating film; and
a gate pad upper electrode connected to the gate pad lower electrode, formed of a same material as the pixel electrode in a same layer as the pixel electrode, and separated from the common electrode by the space provided by the undercut structure.

4. The thin film transistor substrate according to claim 2, wherein the data pad includes:
a data pad lower electrode connected to the data line;
first to third data contact holes passing through the first to third passivation films; and
a data pad upper electrode connected to the data pad lower electrode, formed of a same material as the pixel electrode in a same layer as the pixel electrode, and separated from the common electrode by the space provided by the undercut structure.

5. The thin film transistor substrate according to claim 1, wherein a thickness of the pixel electrode is greater than a thickness of the common electrode.

6. The thin film transistor substrate according to claim 1, wherein a width of the third passivation film is smaller than a width of the second passivation film.

* * * * *